United States Patent [19]

Ohdate

[11] Patent Number: 4,893,173
[45] Date of Patent: Jan. 9, 1990

[54] LOW-INDUCTANCE SEMICONDUCTOR APPARATUS

[75] Inventor: Mituo Ohdate, Fukuoka, Japan

[73] Assignee: Mitsubishi Denki Kabushiki Kaisha, Japan

[21] Appl. No.: 289,441

[22] Filed: Dec. 22, 1988

Related U.S. Application Data

[63] Continuation of Ser. No. 55,542, May 29, 1987, abandoned.

[30] Foreign Application Priority Data

Jun. 4, 1986 [JP] Japan .................................. 61-129665
Jun. 4, 1986 [JP] Japan .................................. 61-129666

[51] Int. Cl.⁴ .................... H01L 21/603; H01L 25/14; H01L 23/04
[52] U.S. Cl. ........................................ 357/79; 357/74; 357/76; 357/77
[58] Field of Search ................... 357/79, 76, 77, 74

[56] References Cited

U.S. PATENT DOCUMENTS 4,499,485  2/1985  Shierz et al. ........................ 357/79
4,591,896  5/1986  Kikuchi ............................. 357/79
4,646,131  2/1987  Amagasa et al. ..................... 357/79

FOREIGN PATENT DOCUMENTS 16-12821   6/1941  Japan .
20-39211  12/1945  Japan .
1073673    6/1967  United Kingdom ................. 357/79

OTHER PUBLICATIONS

Westinghouse Data Book, 1978.

Primary Examiner—Joseph E. Clawson, Jr.
Assistant Examiner—S. V. Clark
Attorney, Agent, or Firm—Leydig, Voit & Mayer

[57] ABSTRACT

A low-inductance semiconductor apparatus has a flat-topped base which support a semiconductor element. A cathode whose height is roughly on the order of its diameter sits atop the semiconductor element. The cathode has a flat upper surface with a threaded hole formed in the center thereof into which a lead with a threaded end can be screwed. The inside of the semiconductor apparatus is sealed by a cap which is secured in an airtight manner to the cathode and to a casing which is secured to the top surface of the base. The base can be either flat-bottomed or studded.

5 Claims, 2 Drawing Sheets

LOW-INDUCTANCE SEMICONDUCTOR APPARATUS

This application is a continuation of application Ser. No. 07/055,542 filed May 29, 1987, abandoned 1/26/89.

BACKGROUND OF THE INVENTION

This invention relates to an improved semiconductor apparatus, and more particularly, it relates to an improved, flat-base or stud-type semiconductor apparatus having a low inductance.

FIG. 1 illustrates the structure of a conventional semiconductor apparatus, which in this case is a stud-type diode. This stud-type diode has a studded diode support 1 which comprises a hexagonal base 1a which is made of copper, a generally cylindrical iron casing 1b, and a threaded stud 1c which is also made of copper. The base 1a and the threaded stud 1c are formed as a single member, while the casing 1b is secured to the upper surface of the base 1a by brazing. A circumferentially-extending flange 1d is formed on the outer surface of the casing 1b. The casing 1b houses a diode 2 which rests atop the base 1a and is in electrical contact therewith. The diode 2 supports a cathode rod 3 which has a circular base 3a and a rod portion 3b which extends perpendicularly upwards from the base 3a. The base 3a of the cathode rod 3 supports an electrically-insulating ceramic ring 4, which in turn supports a steel disk spring 5. The rod portion 3b of the cathode rod 3 passes through the holes in the centers of the ring 4 and the disk spring 5.

The casing 1b is covered by a cap 6 comprising an annular, electriclly-insulating, ceramic end wall 6a, a copper junction pipe 6b which is secured to the inside of the hole at the center of the end wall 6a, and a cylindrical lower portion 6c which is made of iron and which surrounds the casing 1b of the studded support 1. The ceramic end wall 6a is secured to the junction pipe 6b and the cylindrical lower portion 6c by brazing. the lower end of the cylindrical lower portion 6c is welded to the flange 1d of the casing 1b along its entire periphery so as to form an airtight seal. The rod portion 3b of the cathode rod 3 is electrically connected to a lead 7 by the junction pipe 6b. The lead 7 is made from copper stranded wire.

The conventional stud-type diode of FIG. 1 is assembled in the following manner. First, a diode 2 is inserted into the casing 1b of the studded support 1 and placed flat atop the base 1a. Next, the elecctrically-insulating ring 4 and the disk spring 5 are placed over the rod portion 3b of the cathode rod 3 with the ring 5 sandwiched between the upper surface of the base 3a and the disk spring 4. The cathode rod 3 is then inserted into the casing 1b, and the base 3a of the cathode rod 3 is placed atop the base 1a of the studded support 1. The diameter of the electrically-insulating ring 4 is substantially the same as the inner diameter of the casing 1b so that when the ring 4 is inserted into the casing 1b, the cathode rod 3 is automatically centered atop the diode 2.

Next, the disk spring 5 is compressed from above by a suitable pressing apparatus, and while the disk spring 5 is in a compressed state, the upper ends of the casing 1b are plastically deformed inwards, thereby preventing the disk spring 5 from returning to a relaxed state. As a result, the disk spring 5 exerts a downwards force on the ring 4 which presses the base 3a of the cathode rod 3 firmly against the diode 2 and the diode 2 firmly against the base 1a of the studded support 1.

The cap is then placed over the studded support 1 with the cathode rod 3 extending into the center of the junction pipe 6b. The lower end of the cylindrical lower portion 6c of the cap 6 and the flange 1a of the casing 1b are welded to one another to form an airtight seal. Lastly, a lead 7 is inserted into the upper end of the junction pipe 6b, and the junction pipe 6b is crimped by the application of external pressure so as to produce a good mechanical and electrical connection between the rod portion 3b, the walls of the junction pipe 6b, and the lead 7.

The above-described, conventional semiconductor apparatus has the drawbacks that the rod portion 3b of the cathode rod 3 is long and slender and is surrounded by a magnetic material in the form of the disk spring 5. It therefore has a high inductance when current is passing therethrough. Furthermore, because of the structure of the junction pipe 6b, the lead 7 must also be slender, which results in a high inductance. If such a semiconductor apparatus is used as part of a snubber for a gate turnoff thyristor, due to the high inductance of the apparatus, the spike voltage is large at turnoff time and the controllable current of the gate turnoff thyristor is low.

SUMMARY OF THE INVENTION

It is an object of the present invention to provide a semiconductor apparatus which has a low inductance.

It is another object of the present invention to provide a semiconductor apparatus which can be connected to a lead having a large diameter.

It is still another object of the present invention to provide a semiconductor apparatus which is compact.

The inductance of a semiconductor apparatus according to the present invention is decreased by the use of a cathode which is shorter and has a larger diameter than a conventional cathode rod. A pressing means in the form of a disk spring which presses the cathode against a semiconductor element is made of a nonmagnetic material such as stainless steel in order to further decrease the inductance of the apparatus. The cathode has a threaded hole formed in its upper surface into which a lead can be screwed. This manner of connection enables the diameter of the lead to be greater than that of a lead for a conventional semiconductor apparatus, thereby decreasing its inductance.

A semiconductor apparatus according to the present invention comprises an electrically conducting base having a flat upper surface and which serves as a first electrode, a cylindrical casing which is secured to the upper surface of the base in an airtight manner, a semiconductor element which is disposed inside the casing and sits atop the upper surface of the base in electrical contact therewith, a second electrode whose height is roughly on the order of its diameter and which sits atop the upper surface of the semiconductor element inside the casing and is in electrical contact with the semiconductor element and has a flat upper surface in which a threaded hole is formed for an electrical lead with a threaded end, pressing means for pressing the second electrode against the semiconductor element, and a cap having a hole in the center of tis top surface, the inner periphery of the hole being connected to the second electrode in an airtight manner and the periphery of the lower portion of the cap being connected to the cylindrical casing in an airtight manner.

A semiconductor apparatus according to the present invention can be a flat-base or a stud-type semiconductor apparatus. In the former case, the base is flat-bottomed and has a threaded hole formed in its lower surface by means of which it can be connected to a circuit. In the latter case, the base has a threaded stud formed on its lower surface.

BRIEF DESCRIPTION OF THE DRAWINGS

In the drawings, the same reference numerals indicate the same or corresponding parts.

DESCRIPTION OF THE PREFERRED EMBODIMENTS

Figure 1:
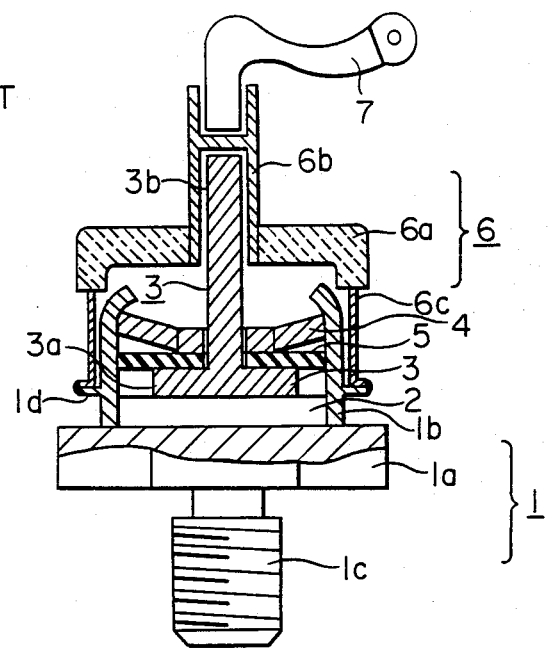
FIG. 1 is a cutaway profile of a conventional stud-type semiconductor apparatus.

Hereinbelow, two preferred embodiments of a semiconductor apparatus in accordance with the present invention will be described while referring to FIGS. 2 and 3 of the accompanying drawings. FIG. 2 illustrates a first embodiment, which is a stud-type diode. This stud-type diode has a conventional studded support 1 comprising a flat-topped, hexagonal, copper base 1a, an iron casing 1b which is secured to the top surface of the base 1a by brazing so as to form an airtight joint, a copper, threaded stud 1c which is integrally formed on the lower surface of the base 1a, and an iron flange 1d which is formed on the outer surface of the casing 1b. The casing 1b surrounds a semiconductor element in the form of a diode 2, although another type of semiconductor element could be used just as well, such as a thyristor or a TRIAC. The diode 2 is supported by the base 1a and is in good electrical contact therewith. The base 1a serves as a first electrode for the diode 2. The diode 2 is sandwiched between the base 1a and a second electrode in the form of a copper cathode 13 whose lower surface is in good electrical contact with the diode 2. The cathode 13 has a generally cylindrical shape, but it is much shorter than the conventional cathode rod 3 shown in FIG. 1, its height being substantially equal to its diameter except for a flat ledge 13a formed around the lower periphery of the cathode 13, while a threaded hole 13b is formed in the center of its top surface. An unillustrated lead having a threaded end can be connected to the cathode 13 by being screwed into this hole 13b. An iron collar 13c is fit over the upper end of the cathode 13 and secured thereto by brazing.

The ledge 13a of the cathode 13 supports a conventional electrically-insulating ceramic ring 4, and the ring 4 supports a disk spring 15 which is made from a nonmagnetic material such as SUS 304 stainless steel. The cathode 13 passes through the holes in the centers of the ring 4 and the disk spring 15. The outer diameters of the ring 4 and the disk spring 15 are substantially the same as the inner diameter of the casing 1b.

The inside of this semiconductor apparatus is sealed by a cap 16 which comprises an annular, ceramic, electrically-insulating midportion 16a, an annular, iron upper portion 16b which is brazed to the midportion 16a, and a cylindrical, iron lower portion 16c which is likewise brazed to the midportion 16a. The upper portion 16b of the cap 16a is welded along the periphery of the hole at its center to the collar 13c of the cathode 13, while the lower end of the lower portion 16c is welded along its entire periphery to the flange 1d of the casing 1b. The welding is performed in a manner so as to produce airtight joints.

Figure 2:
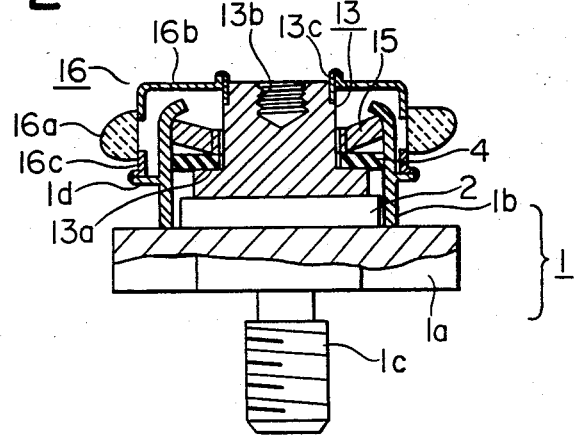
FIG. 2 is a cutaway profile of an embodiment of a stud-type semiconductor apparatus in accordance with the present invention.

The method of assembling the stud-type diode of FIG. 2 is similar to that used for assembling the conventional stud-type diode of FIG. 1. First, a diode 2 is inserted into the casing 1b of the studded support 1 and placed flat atop the base 1a. Next, the electrically-insulating ring 4 and the disk spring 15 are placed over the cathode 13, and the cathode 13 is inserted into the casing 1b with its bottom surface resting atop the diode 2. The disk spring 15 is compressed from above by a suitable pressing apparatus, and while the disk spring 15 is in a compressed state, the upper ends of the casing 1b are plastically deformed inwards so as to retain the disk spring 15 in a compressed state. As a result, the disk spring 15 presses the cathode 13 firmly against the diode 2 and the diode 2 firmly against the base 1a of the studded support 1. the cap 16 is then placed over the casing 1b and is welded to the collar 13c of the cathode 13 and to the flange 1d of the casing 1b so as to produce airtight welds and hermetically seal the diode 2 within the apparatus. An unillustrated lead with a threaded end is then screwed into the threaded hole 13b of the cathode 13.

A stud-type diode according to the present invention is much shorter than a conventional stud-type diode of the type shown in FIG. 1. For example, for a diode of the 400-ampere class, the height from the bottom of the diode 2 to the top of the cap 6 of a conventional stud-type diode is 80 mm, whereas the height is only 25 mm for a stud-type diode according to the present invention. Furthermore, the diameter of the rod portion 3b of the cathode rod 3 of FIG. 1 is generally only 10 mm, while the minimum diameter of the cathode 13 of FIG. 2 is 20 mm. Therefore, the inductance of the cathode 13 itself is much lower than that of a conventional cathode rod 3. The inductance of the apparatus is further decreased by the use of a nonmagnetic disk spring 15 instead of a conventional magnetic disk spring 5. Accordingly, when a stud-type diode according to the present invention is used as part of a snubber for a gate turnoff thyristor, the spike voltage at the time of turnoff is decreased, and the controllable current of the thyristor can be increased.

In addition, since the cathode 13 is connected to a lead by means of a threaded hole 13b, the diameter of the lead can be increased, resulting in a further decrease in the inductance of the snubber.

A semiconductor apparatus according to the present invention has the further advantage that it is more compact than a conventional apparatus due to the reduced height of the cathode 13.

Figure 3:
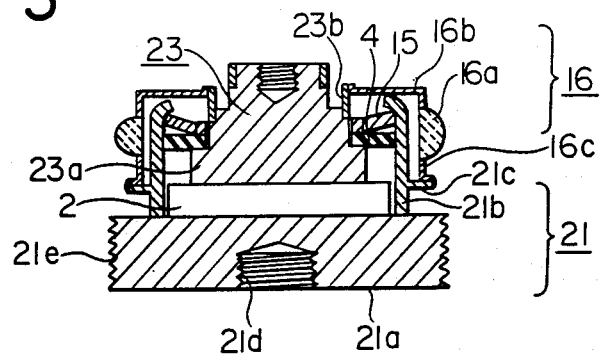
FIG. 3 is a vertical cross-sectional view of an embodiment of a flat-base semiconductor apparatus in accordance with the present invention.

FIG. 3 illustrates a second embodiment of the present invention in the form of a flat-base diode. In this embodiment, the studded support 1 of the previous embodiment is replaced by a flat-bottomed support 21. The flat-bottomed support 21 has a disk-shaped, copper base 21a which forms the bottom of the support 21 and serves as a first electrode. An iron casing 21b which is identical to the iron casing 1b of FIG. 2 is secured to the top surface of the base 21a by brazing. The casing 21b has an iron flange 21c which is formed on its outer surface and which extends around its entire periphery. The base 21a has a threaded hole 21d formed in its bottom surface and external threads 21e formed on its outer periphery. By means of the threaded hole 21d and the external threads 21e, the case 21a can be connected to a suitable electrical connector.

The casing 21b of the support 21 houses a diode 2, a second electrode in the form of a copper cathode 23, an electrically-insulating ceramic ring 4, and a nonmagentic disk spring 15 which are disposed atop one another in the same manner as in the previous embodiment. These members are covered by a cap 16 having the same structure as the cap 16 of FIG. 2. The cathode 23 of this embodiment is slightly different from the cathode 13 of the previous embodiment. It has a circumferentially-extending, flat ledge 23a which supports the electrically-insulating ring 4 and the disk spring 15, and an iron collar 23b which is brazed to the outer periphery of the cathode 23 and is welded to the upper portion 16b of the cap 16. However, in contrast to the cathode 13 of FIG. 2, the upper portion of the cathode 23 of this embodiment protrudes above the top surface of the cap 16. A threaded hole 23c is formed in the center of its top surface, and external threads 23d are formed on its outer periphery. By means of the threaded hole 23c and the external threads 23d, a lead hvaing a threaded end can be connected to the cathode 23. The cathode 23 has substantially the same dimensions as the cathode 13 employed in the previous embodiment, having a height substantially equal to its diameter except for the ledge 23a as shown in FIG. 3, and accordingly it has a much lower inductance than a conventional cathode rod 3. A cathode 23 of this type can be used equally as well with the stud-type semiconductor apparatus of FIG. 2.

The assembly of the embodiment of FIG. 3 is identical to that of the previous embodiment, and the same effects can be obtained.

What is claimed is:

1. A semiconductor apparatus comprising:
   an electrically-conducting base which has a flat upper surface and which serves as a first electrode;
   a cylindrical casing secured to the upper surface of said base in an airtight manner and protruding from said base;
   a semiconductor element which is disposed inside said casing on the upper surface of said base in electrical contact therewith;
   a second electrode, the height of which is substantially equal to its diameter, disposed on said semiconductor element opposite said base inside said casing in electrical contact with said semiconductor element, said second electrode containing a threaded hole and having a flat upper surface from which said threaded hole into which an electrical lead can be screwed is accessible, said second electrode having a ledge proximate said base;
   pressing means for pressing said second electrode against said semiconductor element, said pressing means including a disc spring of a non-magnetic material disposed around said second electrode, within and engaging the inside of said casing, and an electrical insulator disposed between and in contact with said disc spring and said ledge within said casing; and
   a cap having a top surface and an opposed lower portion including a hole in the center of said top surface, the inner periphery of the hole in said cap being secured to said second electrode in an airtight manner and the lower portion of said cap being secured to said cylindrical casing in an airtight manner.

2. A semiconductor apparatus as claimed in claim 1, wherein said second electrode is cylindrical and has threads formed on its outer periphery.

3. A semiconductor apparatus as claimed in claim 1, wherein said base has a lower surface opposite said upper surface and a threaded stud formed on said lower surface.

4. A semiconductor apparatus as claimed in claim 1, wherein said base has a flat lower surface opposite said upper surface and a threaded hole for an electrical connector is formed in the center of its lower surface.

5. A semiconductor apparatus as claimed in claim 4, wherein said base is disk-shaped and has threads formed on its outer periphery.

* * * * *